United States Patent
Kwak (10) Patent No.: US 10,545,822 B2
(45) Date of Patent: Jan. 28, 2020

(54) SEMICONDUCTOR DEVICE

(71) Applicant: SK hynix Inc., Icheon-si Gyeonggi-do (KR)

(72) Inventor: Myung Kyun Kwak, Yongin-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 79 days.

(21) Appl. No.: 15/719,033

(22) Filed: Sep. 28, 2017

(65) Prior Publication Data

US 2018/0293132 A1 Oct. 11, 2018

(30) Foreign Application Priority Data

Apr. 10, 2017 (KR) .................. 10-2017-0045939

(51) Int. Cl.
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC ....... G11C 7/1009; G11C 7/1039; G11C 8/06; G11C 8/18; G11C 16/08; G11C 16/26; G11C 29/04; G11C 29/52; G11C 2029/0411; G06F 11/1068; G06F 11/1072; G06F 11/1048
See application file for complete search history.

(56) References Cited

U.S. PATENT DOCUMENTS

| | | | | |
|---|---|---|---|---|
| 6,111,810 A * | 8/2000 | Fujita | ................... | G11C 7/1072 365/230.03 |
| 6,661,735 B2 * | 12/2003 | Lee | .......... | G11C 7/22 365/191 |
| 7,227,811 B2 * | 6/2007 | Cho | .......... | G11C 8/18 365/230.08 |
| 8,824,228 B2 * | 9/2014 | Ku | .......... | G11C 29/00 365/189.03 |
| 9,070,428 B2 * | 6/2015 | Lee | ....... | G11C 7/1012 |
| 9,607,706 B1 * | 3/2017 | Chae | ....... | G11C 16/08 |

FOREIGN PATENT DOCUMENTS

| KR | 1020040058771 A | 7/2004 |
|---|---|---|
| KR | 1020150001612 A | 1/2015 |

* cited by examiner

*Primary Examiner* — Shelly A Chase
(74) *Attorney, Agent, or Firm* — William Park & Associates Ltd.

(57) ABSTRACT

An address processing circuit may be provided. The address processing circuit may include an address latch control circuit configured to generate a plurality of latch control signals for separately inputting/outputting a normal operation-related address signal or a data error correction operation-related address signal based on a plurality of internal command signals pertaining to a normal operation and an error correction operation. The address processing circuit may include an address latch circuit configured to latch a combined address signal for the normal operation and the error correction operation to a pipe latch according to any one of the plurality of latch control signals, and separately output the latched combined address signal for the normal operation or the data error correction operation according to the other signals of the plurality of latch control signals.

16 Claims, 8 Drawing Sheets

SEMICONDUCTOR DEVICE

CROSS-REFERENCES TO RELATED APPLICATION

The present application claims priority under 35 U.S.C. § 119(a) to Korean application number 10-2017-0045939, filed on Apr. 10, 2017, in the Korean Intellectual Property Office, which is incorporated herein by reference in its entirety.

BACKGROUND

1. Technical Field

Various embodiments may generally relate to a semiconductor device, and, more particularly, to an address latch circuit, an address processing circuit and a semiconductor apparatus.

2. Related Art

The combination of reducing the size of semiconductor apparatuses along with increasing the processing speeds of the semiconductor devices leads to increasing error occurrence rates relating to writing or reading data processes.

To detect and correct such data error, an error correction circuit, i.e., an error check correction (ECC) circuit, is used.

The error correction circuit may generate a parity signal for a plurality of data to be written, correct an error for the plurality of data to be read according to the parity signal, and then output the data.

Therefore, an address for a normal data write operation and an address for an error correction operation require separate processing operations, thus causing an increase in the number of elements of a related circuit.

SUMMARY

In an embodiment, an address latch circuit may be provided. The address latch circuit may be configured to latch a combined secondary preliminary address signal for a normal operation and a data error correction operation to a pipe latch, and separately output the latched combined secondary preliminary address signal for the normal operation or the data error correction operation.

In an embodiment, an address processing circuit may be provided. The address processing circuit may include an address latch control circuit configured to generate a plurality of latch control signals for separately inputting/outputting a normal operation-related address signal or a data error correction operation-related address signal based on a plurality of internal command signals pertaining to a normal operation and an error correction operation. The address processing circuit may include an address latch circuit configured to latch a combined secondary preliminary address signal for the normal operation and the error correction operation to an identical pipe latch according to any one of the plurality of latch control signals, and separately output the latched combined secondary preliminary address signal for the normal operation or the data error correction operation according to the other signals of the plurality of latch control signals.

In an embodiment, a semiconductor apparatus may be provided. The semiconductor apparatus may include an address processing circuit configured to latch a combined secondary preliminary address signal for a normal operation and an error correction operation to a pipe latch, and separately output the latched combined secondary preliminary address signal for the normal operation or the data error correction operation. The semiconductor apparatus may include a memory core circuit configured to control input/output of data corresponding to an output of the address processing circuit based on a command signal. The semiconductor apparatus may include a data error correction circuit configured to perform an error correction operation on read data and write data in connection with the memory core circuit according to the output of the address processing circuit.

DETAILED DESCRIPTION

Hereinafter, embodiments of the present disclosure will be described with reference to the accompanying drawings.

It will be understood that, although the terms first, second, third etc. may be used herein to describe various elements, components, regions, circuits, layers and/or sections, these elements, components, regions, circuits, layers and/or sections should not be limited by these terms. These terms are only used to distinguish one element, component, region, circuit, layer or section from another region, layer or section. Thus, a first element, component, region, layer or section discussed below could be termed a second element, component, region, layer or section without departing from the teachings of the present disclosure.

Various embodiments may be directed to an address processing circuit and a semiconductor apparatus including the same capable of reducing the area of an address processing circuit, and power consumption.

Various embodiments may be directed to a semiconductor device including an address processing circuit and a semiconductor apparatus including the address processing circuit.

Figure 1:
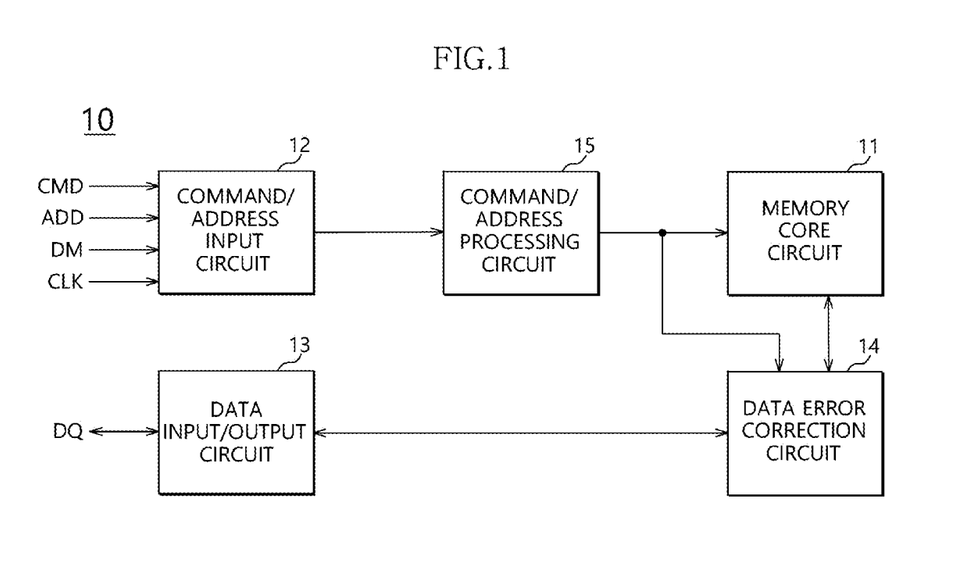
FIG. 1 is a diagram illustrating a configuration of a semiconductor apparatus having a data error correction function in accordance with an embodiment.

Referring to FIG. 1, a semiconductor apparatus 10 having a data error correction function in accordance with an embodiment may include a memory core circuit 11, a command and address (command/address) input circuit 12, a data input and output (input/output) circuit 13, a data error correction circuit 14, and a command/address processing circuit 15.

The memory core circuit 11 may include a memory cell array, a sense amplifier array, a row decoder, a column decoder, and so forth.

The memory core circuit 11 may output data corresponding to an address in response to various kinds of commands, e.g., a read command, a write command, and a masked write signal, or store data inputted from an external device in the memory cell array according to an address.

The command/address input circuit 12 may buffer and output a clock signal CLK, an external command CMD, an external address ADD, and a data mask signal DM.

The data input/output circuit 13 may buffer data DQ and provide it to the data error correction circuit 14, or output data DQ obtained by buffering the output of the data error correction circuit 14 to an external device.

The external command CMD, the external address ADD, and the data mask signal DM may be supplied from an external system provided outside the semiconductor apparatus 10.

Data DQ may be provided from the semiconductor apparatus 10 to the external system during a read operation, or may be provided from the external system to the semiconductor apparatus 10 during a write operation.

The external system may be a system for controlling directly or indirectly the semiconductor apparatus 10 and may include, for example, a central processing unit (CPU), and a graphic processing unit (GPU).

The command/address processing circuit 15 may perform a control operation corresponding to a current operation state for a signal outputted from the command/address input circuit 12 and provide it to the memory core circuit 11 and the data error correction circuit 14.

The control operation of the command/address processing circuit 15 may mean a latch operation, a multiplex operation, or/and a timing control operation, and so forth.

The command/address processing circuit 15 may be configured to share a latch circuit for latching an internal address for a current operation, e.g., a normal write operation, or a masked write operation, and a description thereof will be made later herein.

The masked write operation may be a write operation for error correction.

The data error correction circuit 14 may perform an error correction operation on read data and write data in connection with the memory core circuit 11 according to output of the command/address processing circuit 15.

The address processing circuit 100 in accordance with an embodiment may be included in, e.g., the command/address processing circuit 15 of FIG. 1.

Figure 2:
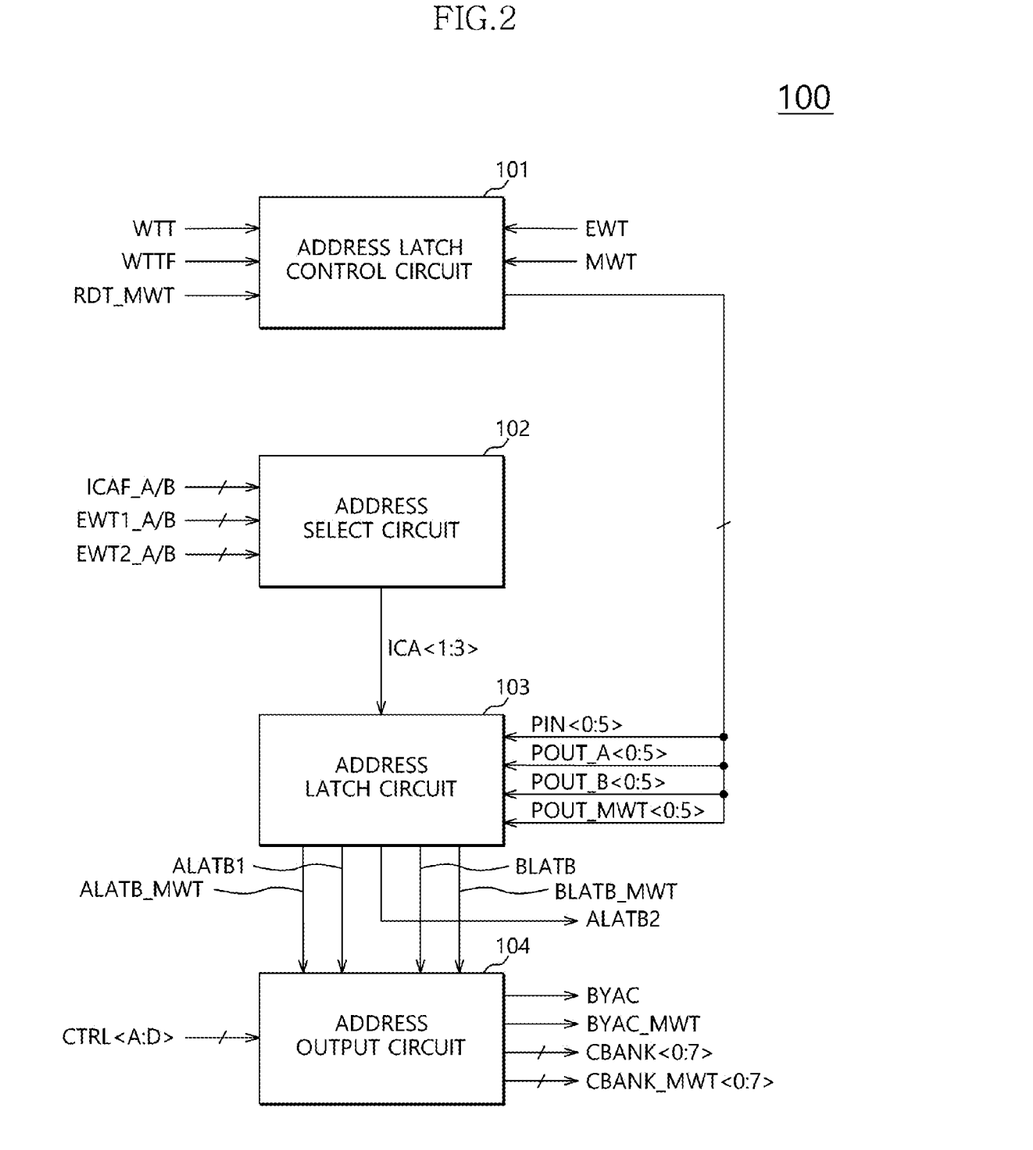
FIG. 2 is a diagram illustrating a configuration of an address processing circuit in accordance with an embodiment.

Referring to FIG. 2, the address processing circuit 100 in accordance with an embodiment may include an address latch control circuit 101, an address select circuit 102, an address latch circuit 103, and an address output circuit 104.

The address latch control circuit 101 may generate a plurality of latch control signals for separately inputting and outputting (inputting/outputting) a normal operation-related address signal or an error correction operation-related address signal based on a plurality of internal command signals pertaining to a normal operation and an error correction operation.

Here, first internal command signals related to the normal operation may include write signals EWT, WTT, and WTTF.

EWT may be an external write signal, i.e., a signal which is directly generated according to a write command provided from the external system.

WTT may be a signal which is generated by delaying the external write signal EWT, and may be a signal delayed by WL+BL/2+X8 delay+ECC delay based on a clock signal CLK to which the external write signal EWT has been inputted.

WTTF may be a signal which is generated by delaying the external write signal EWT, and may be a signal delayed by WL+BL/2 based on the clock signal CLK to which the external write signal EWT has been inputted.

Second internal command signals related to the error correction operation may include a masked write signal MWT, and a masked read signal RDT_MWT.

Here, the masked write signal MWT may be a signal for a write operation related to error correction.

The masked read signal RDT_MWT may be a signal related to a read operation required for performing a write operation related to error correction, and may be a signal delayed by WL+X8 delay based on the clock signal CLK to which the external write signal EWT has been inputted.

Here, WL may be a write latency, BL may be a burst length, the X8 delay may be a time required for 8-bit parallel data output according to X8 which defines the number of unit data to be inputted/outputted according to a single command, and the ECC delay may be a time required for the error correction operation.

The plurality of latch control signals may include a latch input control signal PIN<0:5>, and first to third latch output control signals POUT_A<0:5>, POUT_B<0:5>, and POUT_MWT<0:5>.

The latch input control signal PIN<0:5> may be a signal for latching an address signal. The first to third latch output control signals POUT_A<0:5>, POUT_B<0:5>, and POUT_MWT<0:5> may be signals for outputting latched address signals.

The third latch output control signal POUT_MWT<0:5> may be a signal for outputting an address signal related to an error correction operation among the latched address signals.

The address select circuit 102 may multiplex a primary preliminary address signal ICAF_A/B according to a plurality of select control signals EWT1_A/B and EWT2_A/B and output it as a secondary preliminary address signal ICA<1:3>.

The address latch circuit 103 may latch a combined secondary preliminary address signal ICA<1:3> for the normal operation and the error correction operation to a pipe latch, and separately output the latched address signal as tertiary preliminary address signals ALATB1, ALATB_MWT, ALATB2, BLATB, and BLATB_MWT for the normal operation or the error correction operation according to the first to third latch output control signals POUT_A<0:5>, POUT_B<0:5>, and POUT_MWT<0:5>.

The address output circuit 104 may output the tertiary preliminary address signals ALATB1, ALATB_MWT, ALATB2, BLATB, and BLATB_MWT as internal address signals BYAC, BYAC_NWT, CBANK<0:7>, and CBANK_MWT<0:7> at predetermined timings according to a plurality of timing control signals CTRL<A:D>.

Each of the timing control signals CTRL<A:D> may include a plurality of signal bits.

The signals BYAC and BYAC_MWT among the internal address signals BYAC, BYAC_NWT, CBANK<0:7>, and CBANK_MWT<0:7> may be address signals, e.g., a column address signal, related to a memory cell active operation. The internal address signal BYAC may be an address signal related to the normal operation, and the internal address signal BYAC_NWT may be an address signal related to the error correction operation.

Each of the internal address signals CBANK<0:7> and CBANK_MWT<0:7> may be an address signal for selecting a memory bank. The internal signal CBANK<0:7> may be an address signal related to the normal operation, and the internal signal CBANK_MWT<0:7> may be an address signal related to the error correction operation.

Figure 3:
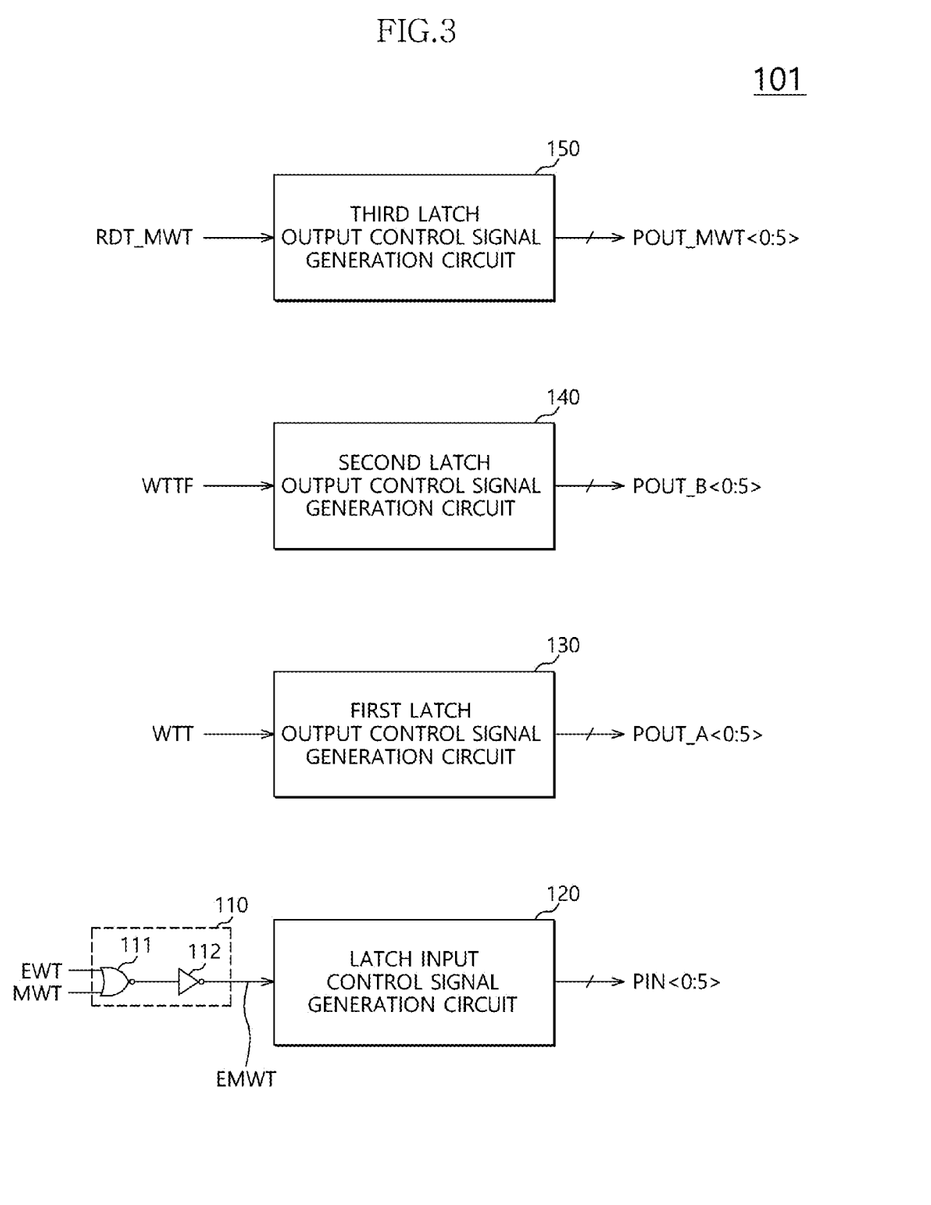
FIG. 3 is a diagram illustrating a configuration of an address latch control circuit of FIG. 2.

Referring to FIG. 3, the address latch control circuit 101 may include a combinational circuit 110, a latch input control signal generation circuit 120, and first to third latch output control signal generation circuits 130 to 150.

The combinational circuit 110 may include logic circuits. The logic circuits of the combination circuit 110 may perform a NOR operation and or an inversion operation. The combinational circuit 110 may include for example but not limited to, a NOR gate 111 and an inverter 112. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

The combinational circuit 110 may generate a signal EMWT which is enabled when either the external write signal EWT or the masked write signal MWT is enabled.

The latch input control signal generation circuit 120 may generate a latch input control signal PIN<0:5> when the signal EMWT is enabled.

The first latch output control signal generation circuit 130 may generate a first latch output control signal POUT_A<0:5> when the signal WTT is enabled.

The second latch output control signal generation circuit 140 may generate a second latch output control signal POUT_B<0:5> when the signal WTTF is enabled.

The third latch output control signal generation circuit 150 may generate a third latch output control signal POUT_MWT<0:5> when the signal RDT_MWT is enabled.

The signals PIN<0:5>, POUT_A<0:5>, POUT_B<0:5> and POUT_MWT<0:5> may be signals that respective signal bits are sequentially enabled with a predetermined time difference.

For example, PIN<0>, PIN<1>, PIN<2>, PIN<3>, PIN<4>, and PIN<5> may be sequentially enabled with a predetermined time difference. POUT_A<0:5>, POUT_B<0:5>, and POUT_MWT<0:5> may also enabled in the same manner as that of the signal PIN<0:5>.

The latch input control signal generation circuit 120 and the first to third latch output control signal generation circuits 130 to 150 may respectively generate the signals PIN<0:5>, POUT_A<0:5>, POUT_B<0:5>, and POUT_MWT<0:5> using an internal counter, a shift register, or the like.

Although not illustrated, the latch input control signal generation circuit 120 and the first to third latch output control signal generation circuits 130 to 150 may also generate signals, e.g., PINB<0:5>, POUTB_A<0:5>, POUTB_B<0:5>, and POUTB_MWT<0:5>, having phases opposite to those of the signals PIN<0:5>, POUT_A<0:5>, POUT_B<0:5>, and POUT_MWT<0:5>, using the internal counter, the shift register, or the like.

Figure 4:
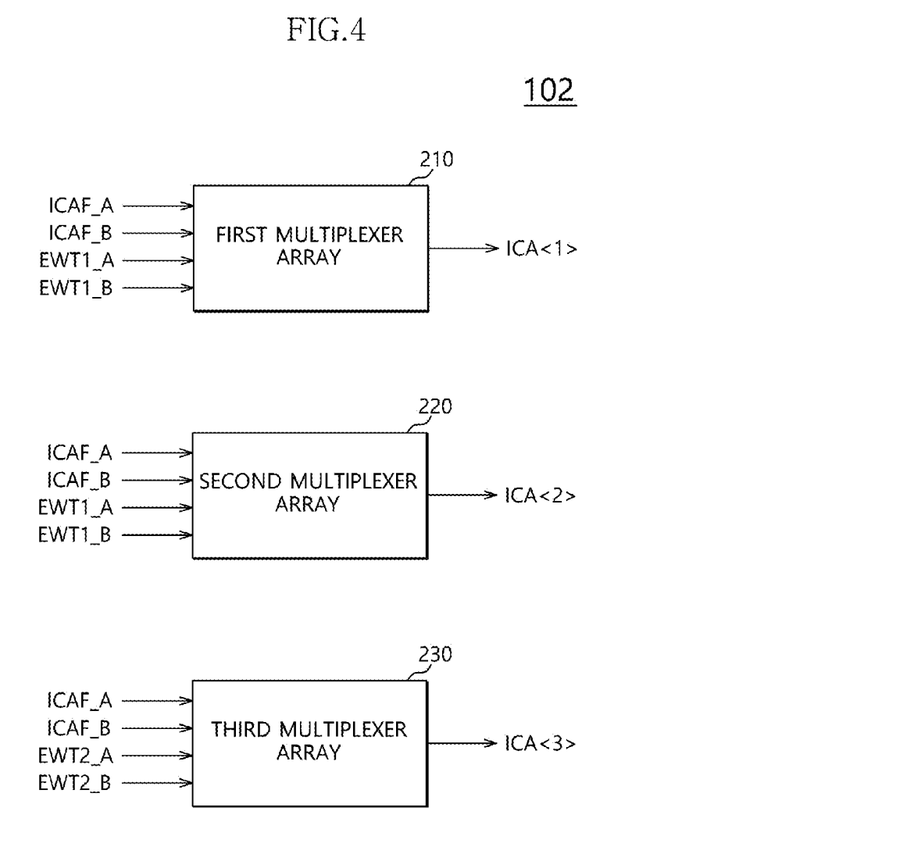
FIG. 4 is a diagram illustrating a configuration of an address select circuit of FIG. 2.

Referring to FIG. 4, the address select circuit 102 may include first to third multiplexer arrays 210 to 230.

The first multiplexer array 210 may multiplex the primary preliminary address signal ICAF_A/B (ICAF_A, ICAF_B) according to a select control signal EWT1_A/B (EWT1_A, EWT1_B) of the plurality of select control signals EWT1_A/B and EWT2_A/B (EWT2_A, EWT2_B) and output it as ICA<1> of the secondary preliminary address signal ICA<1:3>.

The second multiplexer array 220 may multiplex the primary preliminary address signal ICAF_A/B according to the select control signal EWT1_A/B of the plurality of select control signals EWT1_A/B and EWT2_A/B and output it as ICA<2> of the secondary preliminary address signal ICA<1:3>.

The third multiplexer array 230 may multiplex the primary preliminary address signal ICAF_A/B according to a select control signal EWT2_A/B of the plurality of select control signals EWT1_A/B and EWT2_A/B and output it as ICA<3> of the secondary preliminary address signal ICA<1:3>.

Figure 5:
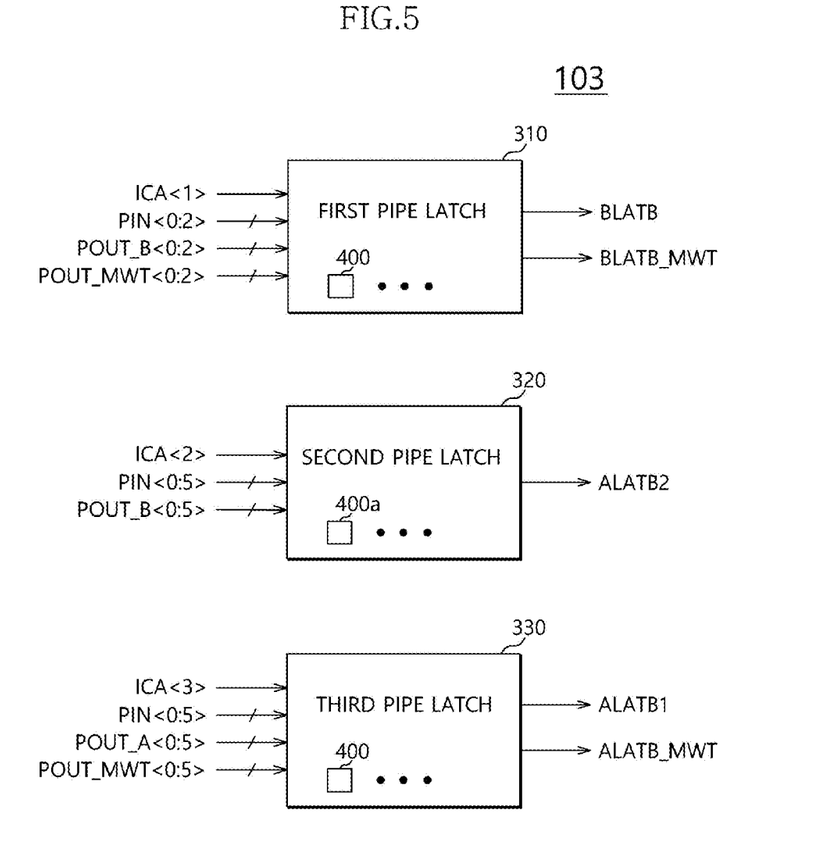
FIG. 5 is a diagram illustrating a configuration of an address latch circuit of FIG. 2.

Referring to FIG. 5, the address latch circuit 103 may include first to third pipe latch 310 to 330.

The first pipe latch 310 may include a plurality of unit latches 400.

The first pipe latch 310 may latch the signal ICA<1> according to PIN<0:2> of the latch input control signal PIN<0:5>, and output the latched signal as BLATB or BLATB_MWT of the tertiary preliminary address signals ALATB1, ALATB_MWT, ALATB2, BLATB, and BLATB_MWT according to POUT_B<0:2> of the second latch output control signal POUT_B<0:5> or POUT_MWT<0:2> of the third latch output control signal POUT_MWT<0:5>.

The plurality of unit latches 400 of the first pipe latch 310 may latch the signal ICA<1> according to each signal bit of PIN<0:2> of the latch input control signal PIN<0:5>.

The plurality of unit latches 400 of the first pipe latch 310 may output latched signals as a tertiary preliminary address signal BLATB according to each signal bit of POUT_B<0:2> of the second latch output control signal POUT_B<0:5>.

The plurality of unit latches 400 of the first pipe latch 310 may output latched signals as a tertiary preliminary address signal BLATB_MWT according to each signal bit of POUT_MWT<0:2> of the third latch output control signal POUT_MWT<0:5>.

Here, an output node (not illustrated, a first output node) for the tertiary preliminary address signal BLATB and an output node (not illustrated, a second output node) for the tertiary preliminary address signal BLATB_MWT may be electrically separated from each other.

The plurality of unit latches 400 of the first pipe latch 310 may be coupled in common with each of the first and second output nodes.

The second pipe latch 320 may include a plurality of unit latches 400a.

The second pipe latch 320 may latch the signal ICA<2> according to the latch input control signal PIN<0:5>, and output the latched signal as ALATB2 of the tertiary preliminary address signals ALATB1, ALATB_MWT, ALATB2, BLATB, and BLATB_MWT according to the second latch output control signal POUT_B<0:5>.

The plurality of unit latches 400a of the second pipe latch 320 may latch the signal ICA<2> according to each signal bit of the latch input control signal PIN<0:5>.

The plurality of unit latches 400a of the second pipe latch 320 may output latched signals as the tertiary preliminary address signal ALATB2 according to each signal bit of the second latch output control signal POUT_B<0:5>.

Here, the plurality of unit latches 400a of the second pipe latch 320 may be coupled in common with an output node (not illustrated, a third output node) for the tertiary preliminary address signal ALATB2.

The third pipe latch 330 may include a plurality of unit latches 400.

The third pipe latch 330 may latch the signal ICA<3> according to the latch input control signal PIN<0:5>, and output the latched signal as ALATB1 or ALATB_MWT of the tertiary preliminary address signals ALATB1, ALATB- _MWT, ALATB2, BLATB, and BLATB_MWT according to the first latch output control signal POUT_A<0:5> or the third latch output control signal POUT_MWT<0:5>.

The plurality of unit latches 400 of the third pipe latch 330 may latch the signal ICA<3> according to each signal bit of the latch input control signal PIN<0:5>.

The plurality of unit latches 400 of the third pipe latch 330 may output latched signals as the tertiary preliminary address signal ALATB1 according to each signal bit of the first latch output control signal POUT_A<0:5>.

The plurality of unit latches 400 of the third pipe latch 330 may output latched signals as the tertiary preliminary address signal ALATB_MWT according to each signal bit of the third latch output control signal POUT_MWT<0:5>.

Here, an output node (not illustrated, a fourth output node) for the tertiary preliminary address signal ALATB1 and an output node (not illustrated, a fifth output node) of the tertiary preliminary address signal ALATB_MWT may be electrically separated from each other.

The plurality of unit latches 400 of the third pipe latch 330 may be coupled in common with each of the fourth and fifth output nodes.

Figure 6:
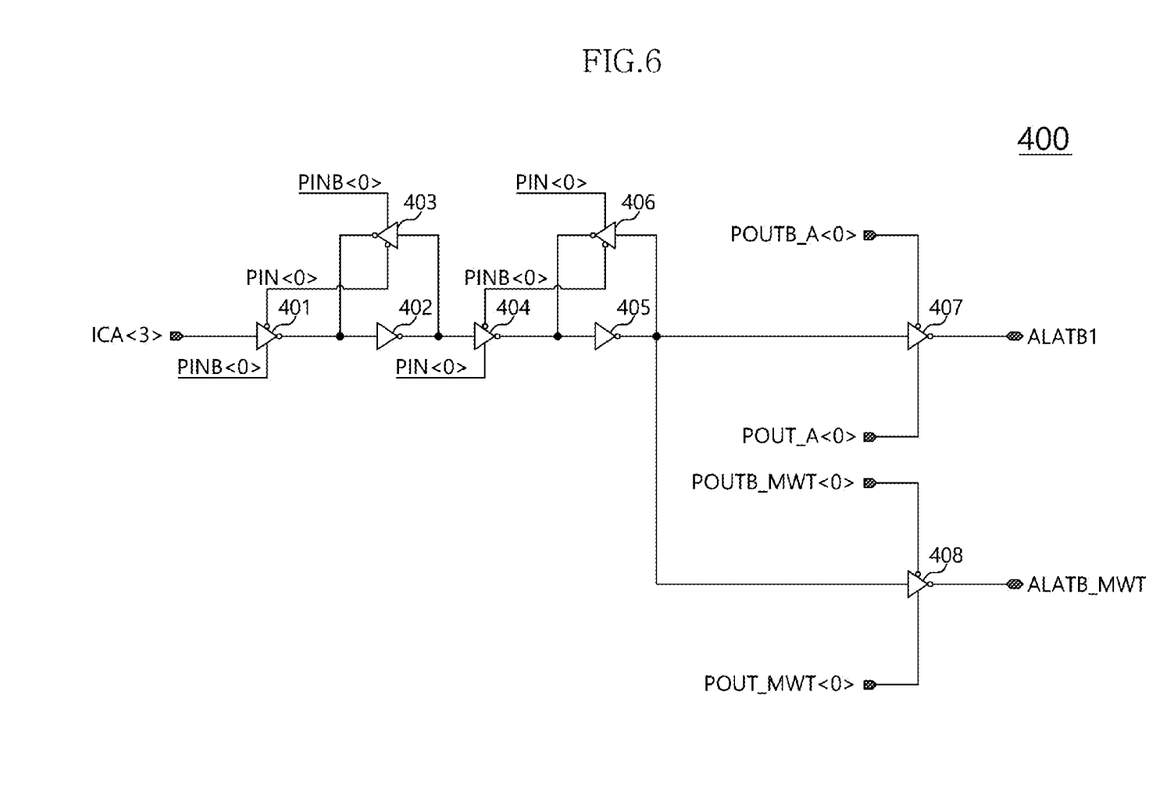
FIG. 6 is a diagram illustrating a configuration of a unit latch of FIG. 5.

Referring to FIG. 6, the plurality of unit latches 400 may have substantially the same configurations except that the input and output signals may be different.

For example, among the plurality of unit latches 400 of the third pipe latch 330, the pipe latch 400 which receives the latch input control signal PIN<0> and the first latch output control signal POUT_A<0> may be configured in an edge trigger manner.

Each of the plurality of unit latches 400 may include a unit latch configured to latch the signal ICA<3>, and an output select circuit configured to separately output a signal latched to the unit latch according to a first latch output control signal POUT_A<0> related to the normal operation or a third latch output control signal POUT_MWT<0> related to the data error correction operation.

The pipe latch 400 may include first to eight inverters 401 to 408.

The first to sixth inverts 401 to 406 may be operated as the unit latch, and the seventh and eight inverters 407 and 408 may be operated as the output select circuit.

The first to third inverters 401 to 403 may latch the signal ICA<3> as the signal PIN<0> toggles to a logic high level. As the signal PIN<0> toggles to a logic high level again, the fourth to sixth inverters 404 to 406 may latch the output of the second inverter 405.

In the case where the signal POUT_A<0> toggles to a logic high level, the output of the fifth inverter 405 may be outputted as the signal ALATB1 through the seventh inverter 407.

In the case where the signal POUT_MWT<0> toggles to a logic high level, the output of the fifth inverter 405 may be outputted as the signal ALATB_MWT through the eighth inverter 408.

Due to the similarities in the above-mentioned structures of the pipe latch 310 to 330, the address latch circuit 103 may process address signals for different purposes, that is, an address signal for a normal write operation and an address signal for an error correction operation, through a sharing circuit configuration, i.e., using a single pipe latch (from one of the pipe latches 400 to 400) to implement and realize the functions of, for example, the three pipe latches 400 to 400. Thus, in an embodiment, for example, the single pipe latch may be included in the address latch circuit 103 without the other two pipe latches to perform the functions of all three pipe latches 400 to 400.

The plurality of unit latches 400a of FIG. 5 may have substantially the same configurations except the fifth inverter 408 of FIG. 6.

Figure 7:
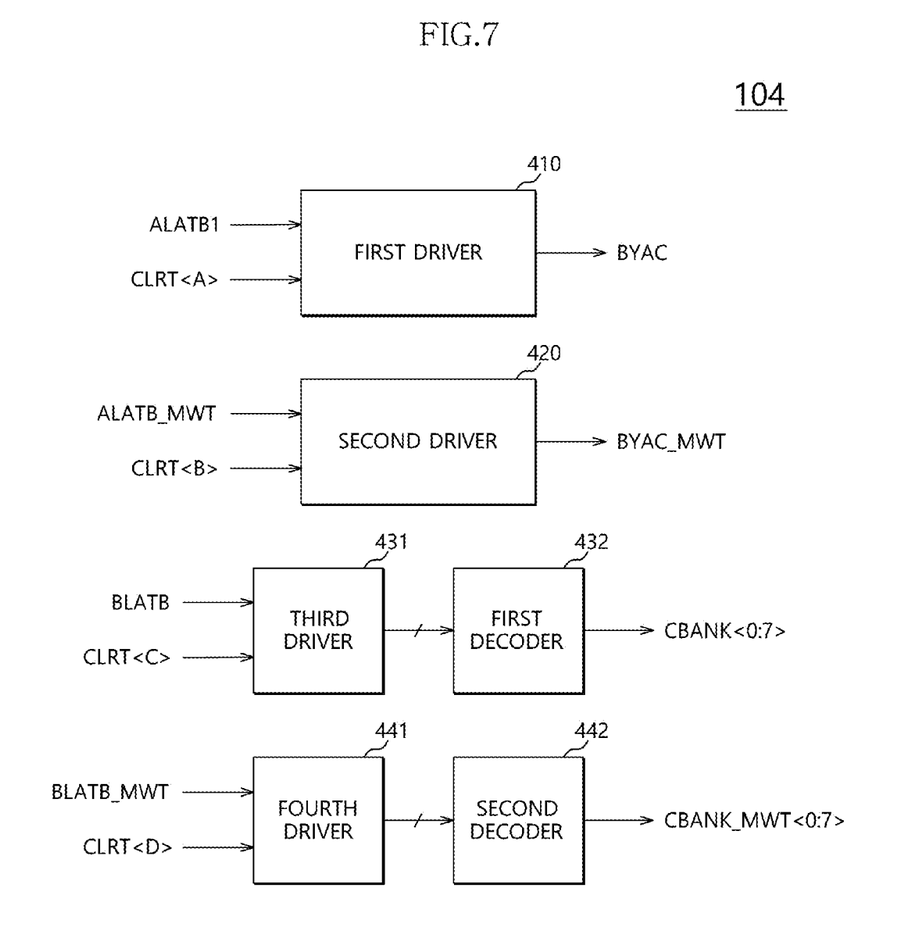
FIG. 7 is a diagram illustrating a configuration of an address output circuit of FIG. 2.

Referring to FIG. 7, the address output circuit 104 may include first to fourth drivers 410, 420, 431, and 441, and first and second decoders 432 and 442.

As described above, each of the timing control signals CTRL<A:D> may include a plurality of signal bits.

The first driver 410 may output a tertiary preliminary address signal ALATB1 as an internal address signal BYAC at a predetermined timing according to a timing control signal CTRL<A>.

The second driver 420 may output a tertiary preliminary address signal ALATB_MWT as an internal address signal BYAC_MWT at a predetermined timing according to a timing control signal CTRL<B>.

The third driver 431 may latch a tertiary preliminary address signal BLATB at a predetermined timing according to a timing control signal CTRL<C> and output a plurality of signals.

The first decoder 432 may decode the plurality of signals outputted from the third driver 431 and output the signals as an internal address signal CBANK<0:7>.

The fourth driver 441 may latch a tertiary preliminary address signal BLATB_MWT at a predetermined timing according to a timing control signal CTRL<D> and output a plurality of signals.

The second decoder 442 may decode the plurality of signals outputted from the fourth driver 441 and output the signals as an internal address signal CBANK_MWT<0:7>.

The semiconductor devices, address latch circuits, address processing circuits, and or semiconductor apparatuses as discussed above (see FIGS. 1-7) are particular useful in the design of other memory devices, processors, and computer systems. For example, referring to FIG. 8, a block diagram of a system employing a semiconductor device, address latch circuit, address processing circuit, and or semiconductor apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 8:
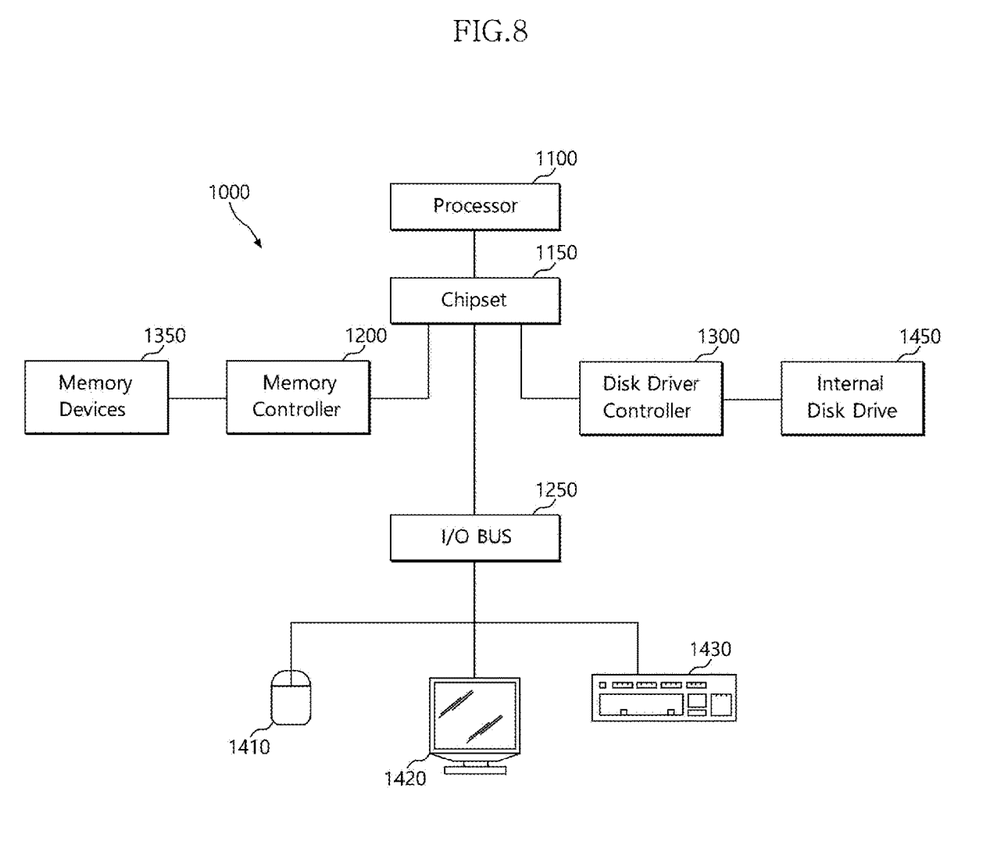
FIG. 8 illustrates a block diagram of an example of a representation of a system employing a semiconductor device, address latch circuit, address processing circuit, and or semiconductor apparatus with the various embodiments discussed above with relation to FIGS. 1-7.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device, address latch circuit, address processing circuit, and or semiconductor apparatus as discussed above with reference to FIGS. 1-7. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device, address latch circuit, address processing circuit, and or semiconductor apparatus as discussed above with relation to FIGS. 1-7, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals is from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 8 is merely one example of a semiconductor device, address latch circuit, address processing circuit, and or semiconductor apparatus as discussed above with relation to FIGS. 1-7. In alternate embodiments, such as, for example but not limited to, cellular phones or digital cameras, the components may differ from the embodiments illustrated in FIG. 8.

While various embodiments have been described above, it will be understood to those skilled in the art that the embodiments described are examples only. Accordingly, the address latch circuits and the semiconductor apparatuses having the same described herein should not be limited based on the described embodiments. Rather, the address latch circuits and the semiconductor apparatuses having the same described herein should only be limited in light of the claims that follow when taken in conjunction with the above description and accompanying drawings.

What is claimed is:

1. An address latch circuit configured to latch a combined address signal for a normal operation and an error correction operation to a pipe latch, and separately output the latched combined address signal for the normal operation or the error correction operation,
wherein the pipe latch comprises:
a unit latch configured to latch the combined address signal according to a latch input control signal; and
an output select circuit configured to separately output a signal latched with the unit latch according to a latch output control signal related to the normal operation or a latch output control signal related to the data error correction operation.

2. An address processing circuit comprising:
an address latch control circuit configured to generate a plurality of latch input and output control signals for separately inputting and outputting (inputting/outputting) a normal operation-related address signal or an error correction operation-related address signal based on a plurality of internal command signals pertaining to a normal operation and an error correction operation; and
an address latch circuit configured to latch a combined address signal for the normal operation and the error correction operation to a pipe latch according to any one of the plurality of latch control signals, and separately output the latched combined address signal for the normal operation or the error correction operation according to the other signals of the plurality of latch control signals.

3. The address processing circuit according to claim 2, further comprising:
an address select circuit configured to output a secondary preliminary address signal by multiplexing a preliminary address signal according to a plurality of select control signals.

4. The address processing circuit according to claim 2, wherein the plurality of internal command signals include a write signal and a masked write signal.

5. The address processing circuit according to claim 2, wherein the address latch control circuit comprises:
a combinational circuit configured to combine the write signal with the masked write signal;
a latch input control signal generation circuit configured to generate a latch input control signal among the plurality of latch control signals according to an output of the combinational circuit; and
a plurality of latch output control signal generation circuits configured to generate the other signals including latch output control signals except the latch input control signal among the plurality of latch control signals according to the write signal.

6. The address processing circuit according to claim 5, wherein any one of the plurality of latch output control signal generation circuits is configured to generate any one of the plurality of latch control signals according to a signal related to a read operation needed to perform a write operation related to data error correction.

7. The address processing circuit according to claim 2, wherein the address latch circuit comprises:
a pipe latch configured to latch the combined address signal according to a latch input control signal of the plurality of latch control signals, and separately output the latched combined address signal according to a latch output control signal related to the normal operation among the plurality of latch control signals or a latch output control signal related to the data error correction operation.

8. The address processing circuit according to claim 7, wherein the pipe latch comprises:
a unit latch configured to latch the combined address signal; and
an output select circuit configured to separately output a signal latched with the unit latch according to the latch output control signal related to the normal operation or the latch output control signal related to the data error correction operation.

9. A semiconductor apparatus comprising:
- an address processing circuit configured to latch a combined address signal for a normal operation and an error correction operation to a pipe latch, and separately output the latched combined address signal for the normal operation or the data error correction operation;
- a memory core circuit configured to control input and output (input/output) of data corresponding to an output of the address processing circuit based on a command signal; and
- a data error correction circuit configured to perform an error correction operation on read data and write data in connection with the memory core circuit according to the output of the address processing circuit.

10. The semiconductor apparatus according to claim 9, wherein the address processing circuit comprises:
- an address latch control circuit configured to generate a plurality of latch input and output control signals for separately inputting and outputting a normal operation-related address signal or an error correction operation-related address signal based on a plurality of internal command signals pertaining to a normal operation and an error correction operation; and
- an address latch circuit configured to latch a combined address signal for the normal operation and the error correction operation to the pipe latch according to any one of the plurality of latch control signals, and separately output the latched address signal for the normal operation or the error correction operation according to the other signals of the plurality of latch control signals.

11. The semiconductor apparatus according to claim 10, further comprising
- an address select circuit configured to output the combined address signal by multiplexing a preliminary address signal according to a plurality of select control signals.

12. The semiconductor apparatus according to claim 10, wherein the plurality of internal command signals include a write signal and a masked write signal.

13. The semiconductor apparatus according to claim 10, wherein the address latch control circuit comprises:
- a combinational circuit configured to combine the write signal with the masked write signal;
- a latch input control signal generation circuit configured to generate a latch input control signal among the plurality of latch control signals according to an output of the combinational circuit; and
- a plurality of latch output control signal generation circuits configured to generate the other signals including latch output control signals except the latch input control signal among the plurality of latch control signals according to the write signal.

14. The semiconductor apparatus according to claim 13, wherein any one of the plurality of latch output control signal generation circuits is configured to generate any one of the plurality of latch control signals according to a signal related to a read operation needed to perform a write operation related to data error correction.

15. The semiconductor apparatus according to claim 10, wherein the address latch circuit comprises:
- a pipe latch configured to latch the combined address signal according to a latch input control signal of the plurality of latch control signals, and separately output the latched combined address signal according to a latch output control signal related to the normal operation among the plurality of latch control signals or a latch output control signal related to the data error correction operation.

16. The semiconductor apparatus according to claim 15, wherein the pipe latch comprises:
- a unit latch configured to latch the combined address signal; and
- an output select circuit configured to separately output a signal latched with the unit latch according to the latch output control signal related to the normal operation or the latch output control signal related to the data error correction operation.

* * * * *